United States Patent
Ouchi

(10) Patent No.: US 7,439,827 B2
(45) Date of Patent: Oct. 21, 2008

(54) SURFACE ACOUSTIC WAVE FILTER DEVICE

(75) Inventor: Minefumi Ouchi, Kanazawa (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 11/773,592

(22) Filed: Jul. 5, 2007

(65) Prior Publication Data

US 2008/0122552 A1    May 29, 2008

Related U.S. Application Data

(63) Continuation of application No. PCT/JP2006/326060, filed on Dec. 27, 2006.

(30) Foreign Application Priority Data

Jan. 20, 2006    (JP)    .............................. 2006-012661

(51) Int. Cl.
*H03H 9/64*    (2006.01)
(52) U.S. Cl. .................... 333/195; 310/313 D; 333/193
(58) Field of Classification Search ................ 333/193, 333/195, 196; 310/313 B, 313 D
See application file for complete search history.

(56) References Cited

U.S. PATENT DOCUMENTS

| 5,309,126 | A | 5/1994 | Allen |
| 5,463,361 | A | 10/1995 | Allen |
| 6,674,345 | B2 | 1/2004 | Nakamura et al. |
| 6,815,868 | B2 | 11/2004 | Shibata et al. |
| 6,853,269 | B2 | 2/2005 | Nakamura et al. |
| 7,378,923 | B2 * | 5/2008 | Takamine .................... 333/193 |
| 2003/0164745 | A1 | 9/2003 | Takamine |
| 2004/0080383 | A1 | 4/2004 | Takamine |
| 2005/0212621 | A1 | 9/2005 | Takamine |

FOREIGN PATENT DOCUMENTS

| JP | 05-267989 A | 10/1993 |
| JP | 08-070233 A | 3/1996 |
| JP | 2002-374147 A | 12/2002 |

(Continued)

OTHER PUBLICATIONS

Official Communication for PCT Application No. PCT/JP2006/326060; mailed Mar. 13, 2007.

(Continued)

*Primary Examiner*—Barbara Summons
(74) *Attorney, Agent, or Firm*—Keating & Bennett, LLP

(57) ABSTRACT

A longitudinally-coupled-resonator surface acoustic wave filter device has a sufficient pass-band width, in which a large attenuation in a stop band near the low-frequency side of a pass band and sharp filter characteristics, and low insertion loss in the pass band are achieved. The filter device is a five-IDT longitudinally-coupled-resonator acoustic wave filter device including a first IDT, second and third IDTs arranged on either side of the first IDT in a direction of propagation of surface waves, and fourth and fifth outermost IDTs in the direction of propagation of surface waves, wherein when the first IDT has the number of electrode fingers N1 and an electrode finger pitch P1, the second and third IDTs have the number of electrode fingers N2 and an electrode finger pitch P2, and the fourth and fifth IDTs have the number of electrode fingers N3 and an electrode finger pitch P3, a relationship of N1<N2, N1<N3, P1<P2, and P1<P3 is satisfied.

6 Claims, 9 Drawing Sheets

FOREIGN PATENT DOCUMENTS

| | | |
|---|---|---|
| JP | 2003-092527 A | 3/2003 |
| JP | 2003-324335 A | 11/2003 |
| JP | 2004-112594 A | 4/2004 |
| JP | 3638270 B2 | 4/2005 |
| WO | 2005/031971 A1 | 4/2005 |

OTHER PUBLICATIONS

Satoshi Ichikawa et al., "Mode Analysis of 5-IDT-type Longitudinal Multi-Mode SAW Resonator Filter," Toshiba Corporation Display Device & Componenets Company, Device Engineering Department, pp. 1-8, Dec. 17, 2001.

\* cited by examiner

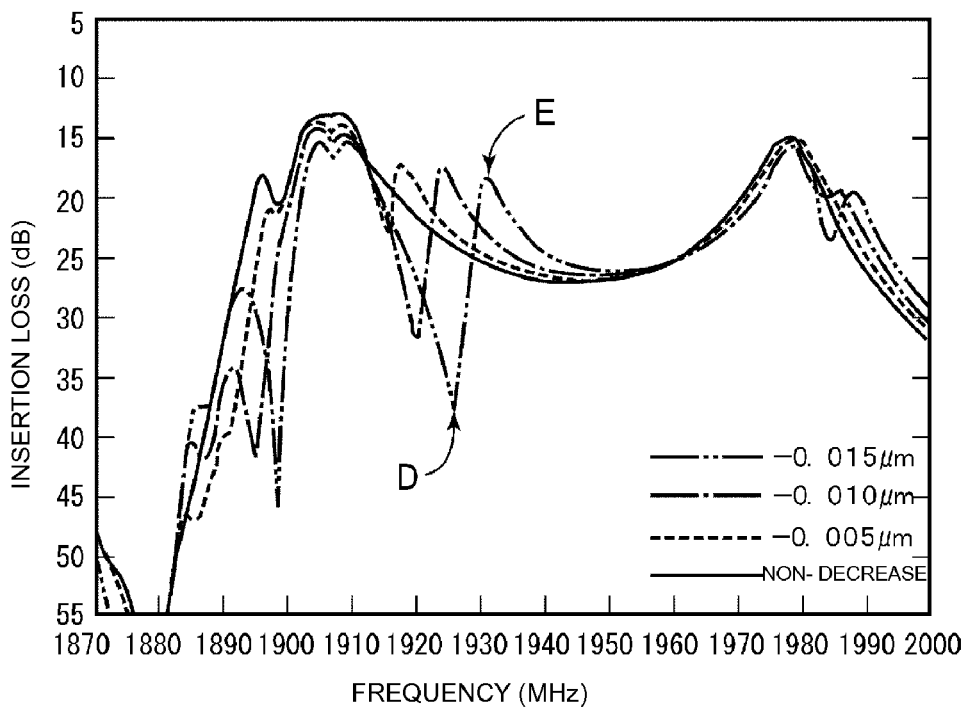
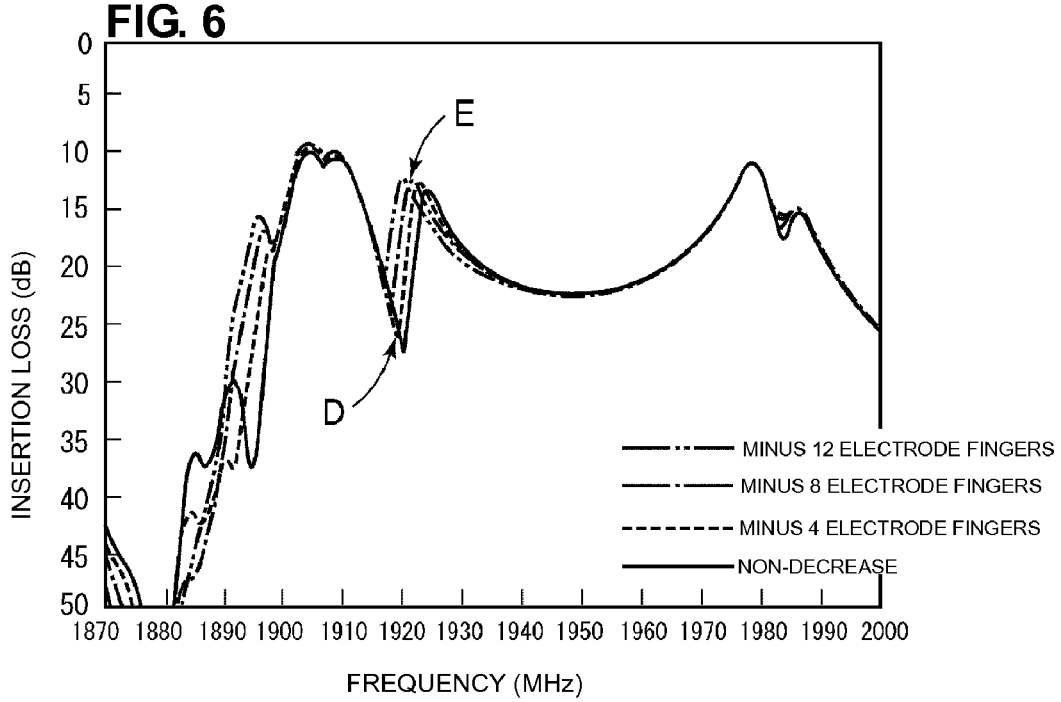

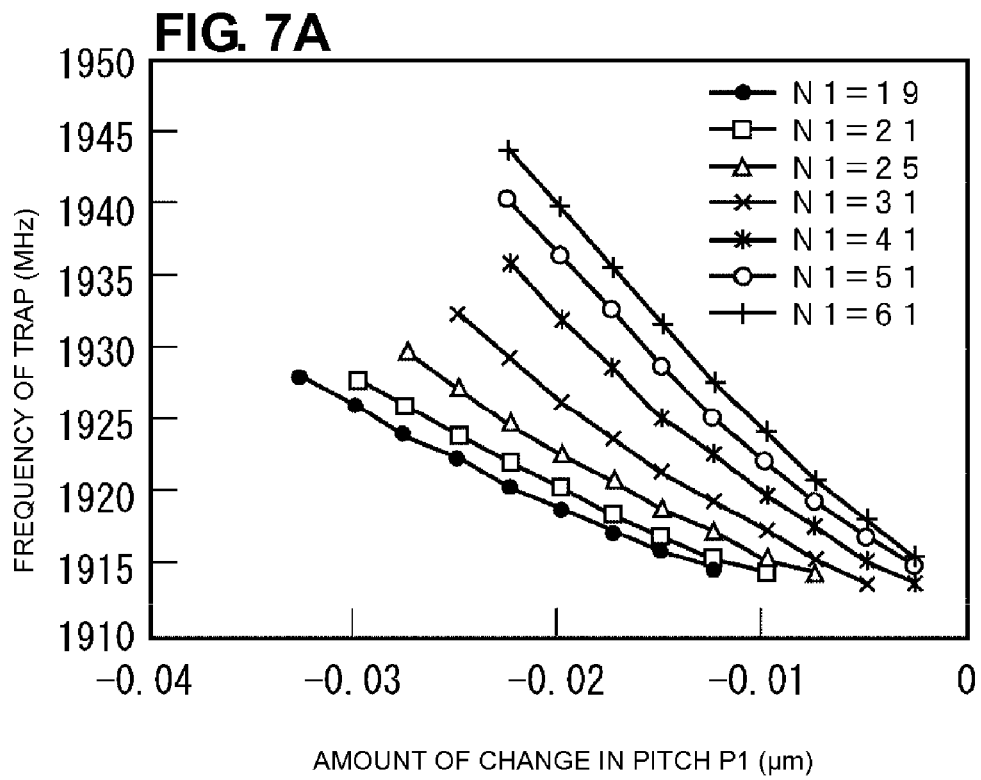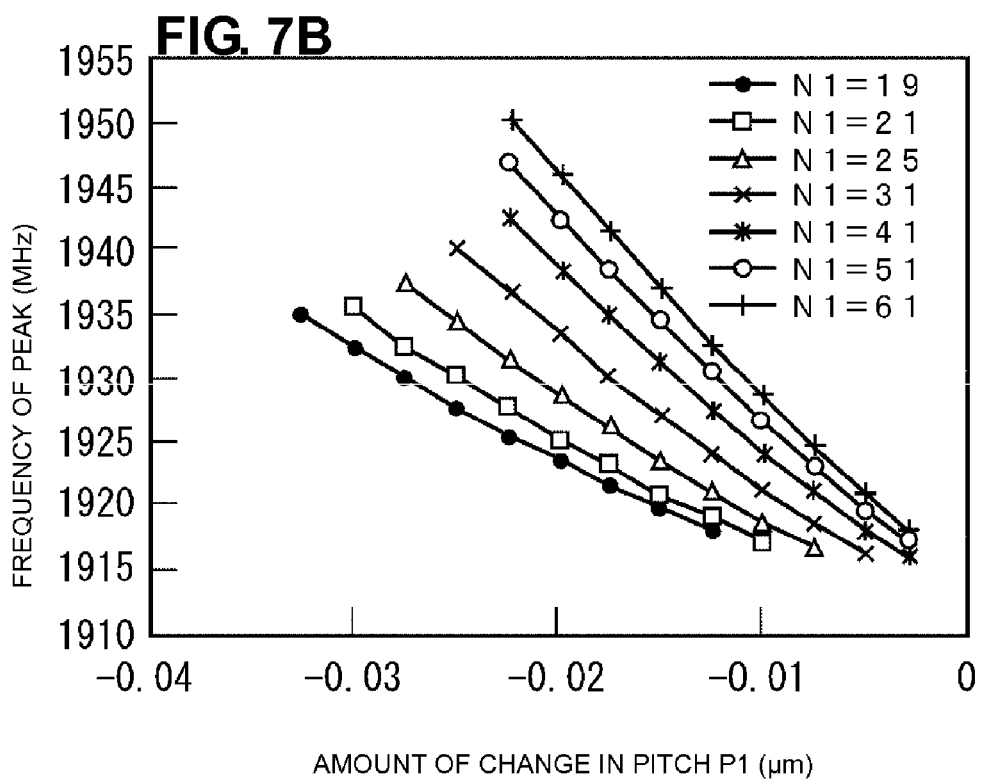

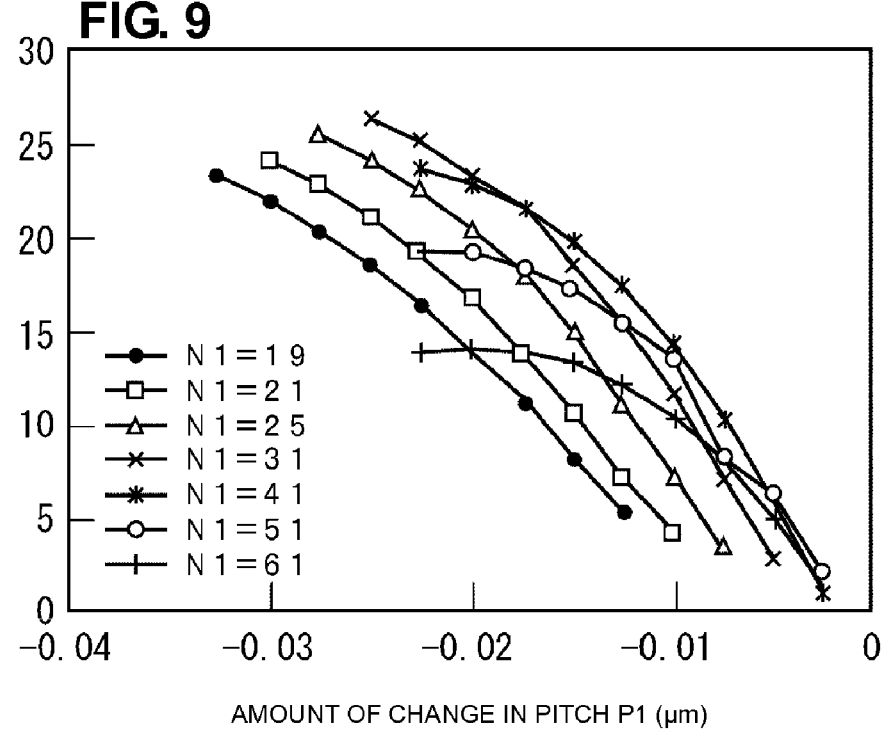
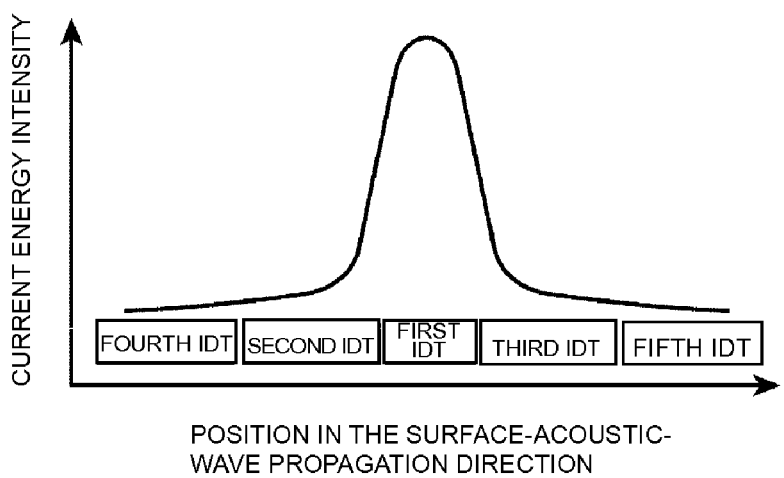

SURFACE ACOUSTIC WAVE FILTER DEVICE

FIELD OF THE INVENTION

The present invention relates to surface acoustic wave filter devices used as band-pass filters in, for example, mobile communication apparatuses. More specifically, the present invention relates to a five-IDT longitudinally-coupled-resonator surface acoustic wave filter device.

DESCRIPTION OF THE RELATED ART

Recently, longitudinally-coupled-resonator surface acoustic wave filters have been widely used as RF-stage band-pass filters in mobile communication apparatuses such as mobile phones. Japanese Unexamined Patent Application Publication No. 2003-92527 discloses, as this type of longitudinally-coupled-resonator surface acoustic wave filter, a five-IDT longitudinally-coupled-resonator surface acoustic wave filter 501 shown in FIG. 16.

The five-IDT longitudinally-coupled-resonator surface acoustic wave filter 501 has five IDTs 511 to 515 arranged in a direction of propagation of surface waves. On either side of a portion in the direction of propagation of surface waves where the five IDTs are disposed, reflectors 516 and 517 are disposed. The IDT located at the center of the five IDTs 511 to 515 is referred to as a first IDT 511. The pair of IDTs positioned on either side of the first IDT 511 is referred to second and third IDTs 512 and 513, and the outermost IDTs in the direction of propagation of surface waves are referred to as fourth and fifth IDTs 514 and 515. In this case, the number of electrode fingers and electrode finger pitch of the first IDT 511 are represented by N1 and P1, respectively; the number of electrode fingers and electrode finger pitch of the second and third IDTs 512 and 513 are represented by N2 and P2, respectively; and the number of electrode fingers and electrode finger pitch of the fourth and fifth IDTs 514 and 515 are represented by N3 and P3, respectively. In Japanese Unexamined Patent Application Publication No. 2003-92527, a relationship of N1>N2>N3 and P1>P2>P3 is satisfied. With this structure, the peak frequencies of the radiation characteristics of the plurality of IDTs 511 to 515 are substantially equal to each other, and wide-band filter characteristics can be obtained.

In the five-IDT longitudinally-coupled-resonator surface acoustic wave filter 501 disclosed in Japanese Unexamined Patent Application Publication No. 2003-92527, however, the out-of-band attenuation cannot be sufficiently increased although the bandwidth of a pass band can be increased. Particularly in a stop band near the low-frequency side of the pass band, a sufficiently large attenuation cannot be obtained, and sharp filter characteristics cannot be obtained.

SUMMARY OF THE INVENTION

In order to overcome the problems described above, preferred embodiments of the present invention provide a five-IDT longitudinally-coupled-resonator surface acoustic wave filter device with large attenuation in a stop band near a pass band and sharp filter characteristics.

According to a preferred embodiment of the present invention, a longitudinally-coupled-resonator surface acoustic wave filter device includes a piezoelectric substrate, a first IDT disposed on the piezoelectric substrate, second and third IDTs disposed on either side of the first IDT in a direction of propagation of surface waves, fourth and fifth IDTs disposed on either side of a portion in the direction of propagation of surface waves where the first to third IDTs are disposed, and first and second reflectors disposed on either side of a portion in the direction of propagation of surface waves where the first to fifth IDTs are disposed, wherein when the number of electrode fingers and electrode finger pitch of the first IDT are represented by N1 and P1, respectively, the number of electrode fingers and electrode finger pitch of the second and third IDTs are represented by N2 and P2, respectively, and the number of electrode fingers and electrode finger pitch of the fourth and fifth IDTs are represented by N3 and P3, respectively, the numbers of electrode fingers and electrode finger pitches of the first to fifth IDTs are determined so as to satisfy a relationship of N1<N2, N1<N3, P1<P2, and P1<P3.

In a specific preferred embodiment of the present invention, the filter device further includes an unbalanced signal terminal, and first and second balanced signal terminals, wherein the second IDT is different in phase by 180° from the third IDT, one end of each of the second and third IDTs is connected to the unbalanced signal terminal, the first IDT is divided into a first divided IDT portion and a second divided IDT portion in the direction of propagation of surface waves, the first divided IDT portion and the fourth IDT are connected to the first balanced signal terminal, and the second divided IDT portion and the fifth IDT are connected to the second balanced signal terminal. In this case, according to a preferred embodiment of the present invention, a surface acoustic wave filter device with increased attenuation in a stop band near the low-frequency side of a pass band and having a balance-unbalance conversion function can be provided.

In another specific preferred embodiment of the present invention, the filter device further includes an unbalanced signal terminal, and first and second balanced signal terminals, wherein the second IDT is different in phase by 180° from the third IDT, one end of each of the first, fourth, and fifth IDTs is connected to the unbalanced signal terminal, the second IDT is connected to the first balanced signal terminal, and the third IDT is connected to the second balanced signal terminal. In this case, according to a preferred embodiment of the present invention, a surface acoustic wave filter device with increased attenuation in a stop band near the low-frequency side of a pass band and having a balance-unbalance conversion function can be provided.

In still another preferred embodiment of the surface acoustic wave filter device of the present invention, at least one one-terminal-pair surface acoustic wave resonator is connected to the first and second balanced signal terminals and/or the unbalanced signal terminal. Since at least one inner-terminal-pair surface acoustic wave resonator is connected in the manner described above, large attenuation in the high-frequency side of a pass band can be obtained.

In still another aspect of the surface acoustic wave filter device according to the present invention, in each of one and/or the other one of any two adjacent IDTs in both portions where the first and second IDTs are adjacent to each other and where the second and fourth IDTs are adjacent to each other, or in both portions where the first and third IDTs are adjacent to each other and where the third and fifth IDTs are adjacent to each other, series weighting is applied to a plurality of electrode fingers including an outermost electrode finger that is most adjacent to the other IDT. In this case, excitation is weakened on both sides of a floating electrode described below disposed in the portion where the series weighting is applied, and therefore balance can be improved.

A surface acoustic wave filter device according to a preferred embodiment of the present invention is a five-IDT longitudinally-coupled-resonator surface acoustic wave filter device having first to fifth IDTs, in which when the number of electrode fingers and electrode finger pitch of the first IDT are represented by N1 and P1, respectively, the number of electrode fingers and electrode finger pitch of the second and third IDTs are represented by N2 and P2, respectively, and the number of electrode fingers and electrode finger pitch of the fourth and fifth IDTs are represented by N3 and P3, respectively, the numbers of electrode fingers and electrode finger pitches of the first to fifth IDTs are determined so as to satisfy a relationship of N1<N2, N1<N3, P1<P2, and P1<P3. Therefore, large attenuation in a stop band near the low-frequency side of a pass band can be obtained, and sharp filter characteristics can be also obtained. Further, the insertion loss in the pass band can be reduced.

According to various preferred embodiments of the present invention, therefore, a five-IDT longitudinally-coupled-resonator surface acoustic wave filter device with large out-of-band attenuation and low loss can be provided.

Other features, elements, steps, characteristics and advantages of the present invention will be described below with reference to preferred embodiments thereof and the attached drawings.

BRIEF DESCRIPTION OF THE DRAWINGS

FIG. 5 is a diagram showing changes in a trap and resonance peak appearing on the low-frequency side of a pass band when an electrode finger pitch P1 is changed stepwise by about 0.005 μm.

FIG. 6 is a diagram showing changes in the position of a trap and resonance peak when the number of electrode fingers N1 of a first IDT is reduced stepwise by four.

FIGS. 7A and 7B are diagrams showing the amount of change in the electrode finger pitch P1 of the first IDT and changes in the frequency position of a trap D and a peak E when the electrode finger pitch P1 is changed.

FIG. 9 is a diagram showing the relationship between the amount of change when the electrode finger pitch P1 of the first IDT is changed and a difference between the attenuations of the trap D and resonance peak E appearing on the low-frequency side of the pass band.

FIG. 10 is a diagram schematically showing the energy distribution of a current in the first to fifth IDTs disposed in a direction of propagation of surface waves.

DETAILED DESCRIPTION OF PREFERRED EMBODIMENTS

Preferred embodiments of the present invention will be described with reference to the drawings after describing the problems in the related art described in Japanese Unexamined Patent Application Publication No. 2003-92527 with respect to more detailed data.

Figure 2:
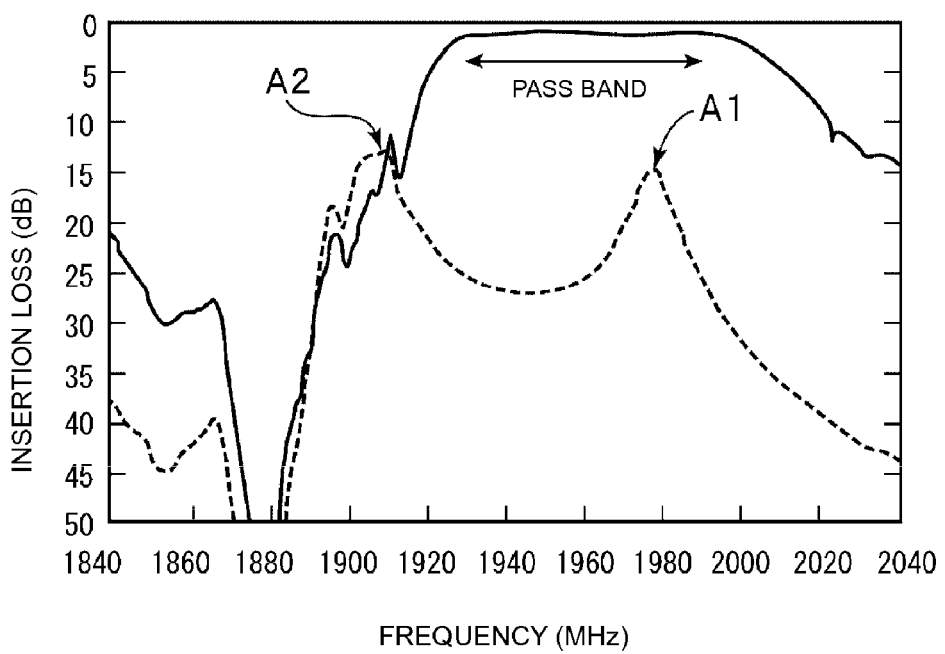
FIG. 2 is a diagram showing a transmission characteristic of a longitudinally-coupled-resonator surface acoustic wave filter device of the related art when N1=N2=N3 and P1=P2=P3, and a transmission characteristic with one-ohm termination.
Figure 16:
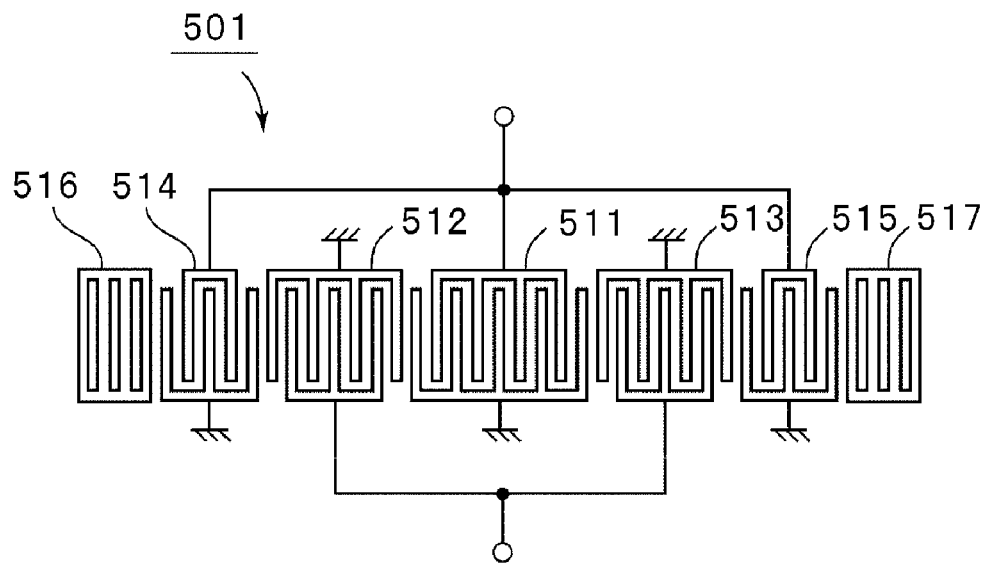
FIG. 16 is a schematic plan view showing an electrode structure of a five-IDT longitudinally-coupled-resonator surface acoustic wave filter device of the related art.

In FIG. 2, a solid line indicates a transmission characteristic of the five-IDT longitudinally-coupled-resonator surface acoustic wave filter device 501 shown in FIG. 16 when the numbers of electrode fingers N1, N2, and N3 and electrode finger pitches P1, P2, and P3 of the surface acoustic wave filter device satisfy a relationship of N1=N2=N3 and P1=P2=P3, and a broken line indicates a transmission characteristic with one-ohm termination. The transmission characteristic with one-ohm termination is one of mode analysis techniques effective to search for a peak frequency obtained by mode coupling of the surface acoustic wave filter device.

FIG. 2 shows characteristics obtained when N1=N2=N3=41 and P1=P2=P3=1.024 μm. Other specifications are as follows:

Specification of the surface acoustic wave filter device 501:
a five-IDT longitudinally-coupled-resonator surface acoustic wave filter was defined on a 40±5° Y-cut X-propagation $LiTaO_3$ substrate using Al electrodes.
Interdigital length of electrode fingers of the IDTs=55 μm
Number of electrode fingers of the reflectors=100
Metallization ratio=0.7
Electrode film thickness=0.08 $\lambda_r$ (where $\lambda_r$ denotes the wavelength defined by the electrode finger pitch of the reflectors, i.e., twice the electrode finger pitch of the reflectors)

As is apparent from the transmission characteristic with one-ohm termination indicated by the broken line shown in FIG. 2, it is found that a peak A1 exists in a pass band and a peak A2 exists in a stop band. That is, it is found that a peak induced by mode coupling exists in the stop band.

Figure 3:
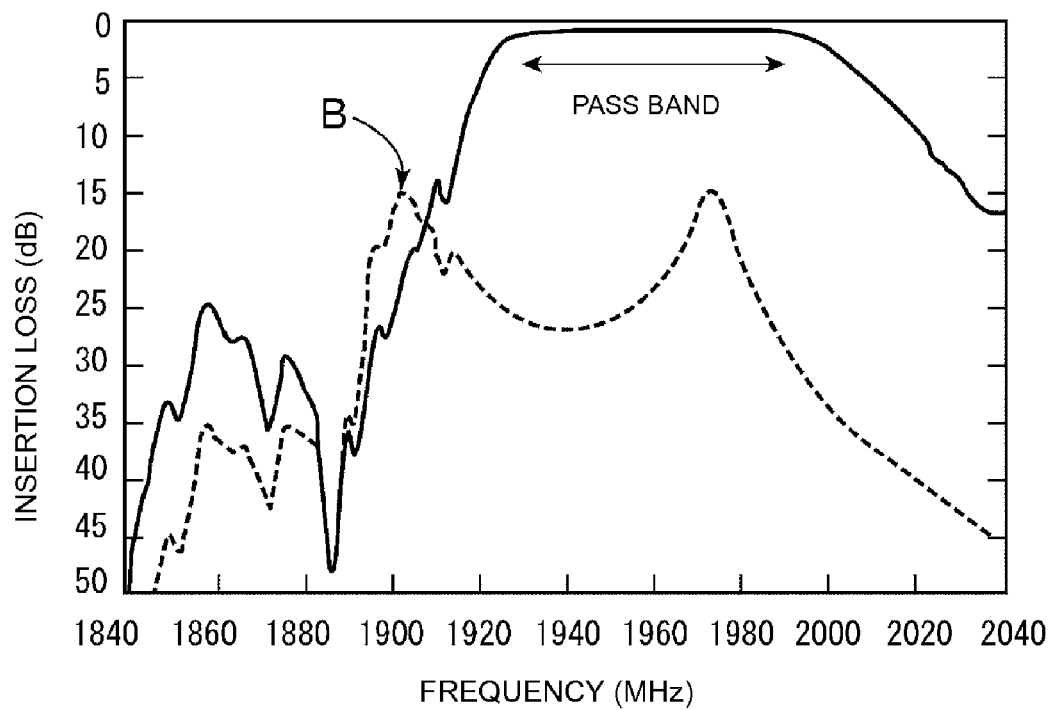
FIG. 3 is a diagram showing a transmission characteristic of the longitudinally-coupled-resonator surface acoustic wave filter device of the related art when N1>N2 and N3, and P1>P2 and P3, and a transmission characteristic with one-ohm termination.

FIG. 3 shows a transmission characteristic of the longitudinally-coupled-resonator surface acoustic wave filter device 501 when N1=55, N2=51, N3=27, P1=1.027 μm, P2=1.026 μm, and P3=1.022 μm, as indicated by a solid line, and a transmission characteristic with one-ohm termination, as indicated by a broken line. That is, a relationship of N1>N2>N3 and P1>P2>P3 is satisfied.

As is apparent from FIG. 3, it is found that in the transmission characteristic with one-ohm termination indicated by the broken line, a peak B induced by mode coupling appears in a stop band, as in the case shown in FIG. 2.

The peak A1 induced by mode coupling, etc., are required to define a pass band. However, as is apparent from the transmission characteristics shown in FIGS. 2 and 3, it is found that if the peak A2 or B exists in a stop band, particularly in a stop band near a pass band, there arises a problem in that the attenuation in the stop band near the low-frequency side of the pass band is not sufficiently large.

Figure 1:
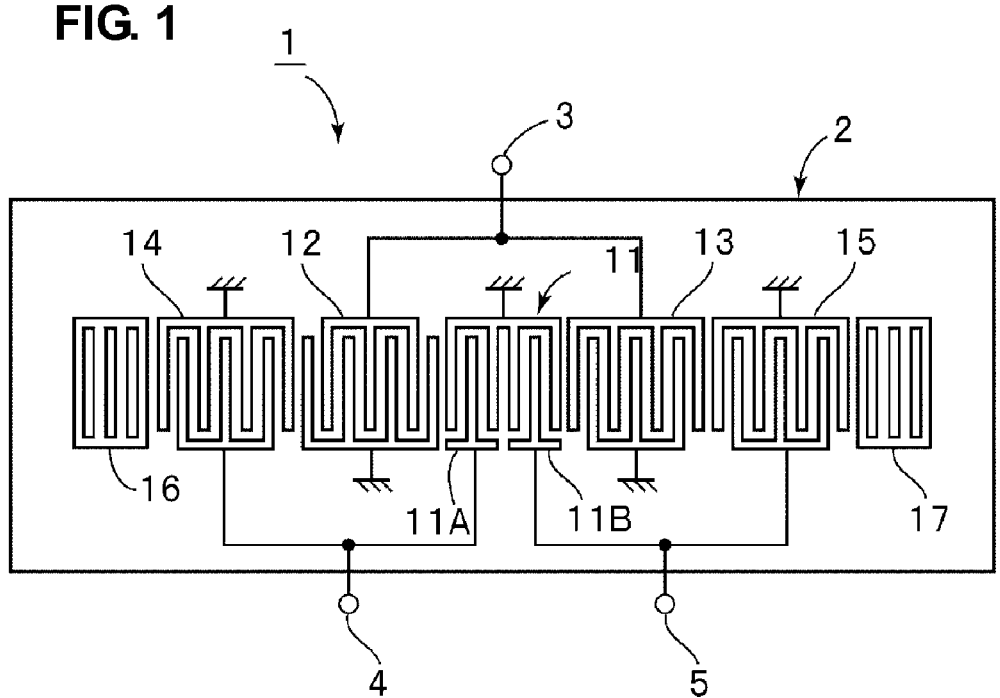
FIG. 1 is a schematic plan view of a longitudinally-coupled-resonator surface acoustic wave filter device according to a first preferred embodiment of the present invention.

FIG. 1 is a schematic plan view showing an electrode structure of a surface acoustic wave filter device according to a first preferred embodiment of the present invention configured to overcome the foregoing problem.

The surface acoustic wave filter device 1 is a five-IDT longitudinally-coupled-resonator surface acoustic wave filter device, and is used as a band-pass filter for PCS reception in the present preferred embodiment. Therefore, a design pass band ranging from 1930 MHz to 1990 MHz is preferably used.

The longitudinally-coupled-resonator surface acoustic wave filter device preferably includes a piezoelectric substrate 2. The piezoelectric substrate 2 is preferably formed of a 40±5° Y-cut X-propagation $LiTaO_3$ substrate. However, the piezoelectric substrate 2 may be formed of any other crystal orientation $LiTaO_3$ substrate, or any other piezoelectric single-crystal substrate or piezoelectric ceramic substrate.

The illustrated electrode structure is defined on the piezoelectric substrate 2. The longitudinally-coupled-resonator surface acoustic wave filter device 1 includes an unbalanced signal terminal 3 and first and second balanced signal terminals 4 and 5, and has a balance-unbalance conversion function.

The IDT located at the center of the five IDTs in a direction of propagation of surface waves is referred to as a first IDT 11. On either side of the first IDT 11, second and third IDTs 12 and 13 are disposed. Fourth and fifth outermost IDTs 14 and 15 are disposed in the direction of propagation of surface acoustic waves.

The first IDT 11 is divided into two parts in the direction of propagation of surface acoustic waves, and has a first divided IDT portion 11A and a second divided IDT portion 11B.

On either side of a portion in the direction of propagation of surface waves where the first to fifth IDTs 11 to 15 are disposed, first and second reflectors 16 and 17 are disposed.

First ends of the second and third IDTs 12 and 13 are commonly connected to the unbalanced signal terminal 3. Second ends of the second and third IDTs 12 and 13 are connected to a ground potential.

A first end of the fourth IDT 14 and a first end of the first divided IDT portion 11A of the first IDT 11 are commonly connected, and are further connected to the first balanced signal terminal 4. Second ends of the IDT 14 and the first divided IDT portion 11A are connected to the ground potential.

First ends of the second divided IDT portion 11B of the first IDT 11 and the fifth IDT 15 are commonly connected, and are connected to the second balanced signal terminal 5. Second ends of the second divided IDT portion 11B and the fifth IDT 15 are connected to the ground potential.

The polarity of the third IDT 13 is different by 180 degrees from the polarity of the second IDT 12, and therefore signals different in phase by 180 degrees are obtained from the balanced signal terminals 4 and 5.

The divided IDT portions 11A and 11B are connected in series by the electrodes of the IDT 11 connected to the ground potential.

In the longitudinally-coupled-resonator surface acoustic wave filter device 1 of the present preferred embodiment, the number of electrode fingers and electrode finger pitch of the first IDT 11 are represented by N1 and P1, respectively; the number of electrode fingers and electrode finger pitch of the second and third IDTs 12 and 13 are represented by N2 and P2, respectively; and the number of electrode fingers and electrode finger pitch of the fourth and fifth IDTs 14 and 15 are represented by N3 and P3, respectively. Since a relationship of N1<N2, N1<N3, P1<P2, and P1<P3 is satisfied, large attenuation in a stop band near the low-frequency side of a pass band can be obtained, and sharp filter characteristics can also be obtained. Further, low insertion loss in the pass band can be achieved. These advantages will now be described with respect to more specific experiment data.

Figure 4:
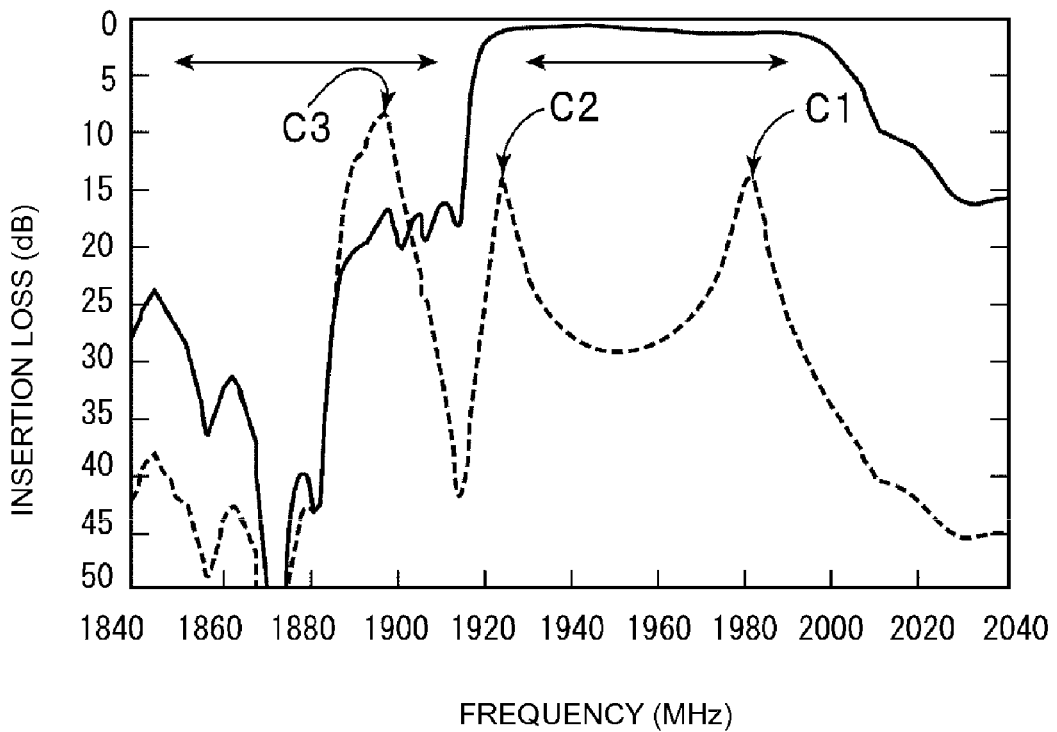
FIG. 4 is a diagram showing a transmission characteristic of the longitudinally-coupled-resonator surface acoustic wave filter device according to the first preferred embodiment of the present invention, and a transmission characteristic with one-ohm termination.

The wavelength defined by the electrode finger pitches of the reflectors 16 and 17 is represented by $\lambda_r$, and the surface acoustic wave filter device 1 of the present preferred embodiment was manufactured using a material similar to that of the surface acoustic wave filter device 501 described above while satisfying the following specifications:

Interdigital length of the electrode fingers=55 μm
Number of electrode fingers of the IDTs (in the order of the fourth IDT 14, the second IDT 12, the first IDT 11, the third IDT 13, and the fifth IDT 15): 59, 63, 26, 63, and 59
Number of electrode fingers of the reflectors=100
Metallization ratio: 0.7
Electrode film thickness=0.08 $\lambda_r$
Electrode finger pitch P1 of the IDT 11=1.009 μm, electrode finger pitch P2=P3=1.036 μm In FIG. 4, a solid line indicates a transmission characteristic of the longitudinally-coupled-resonator surface acoustic wave filter device of the above-described preferred embodiment, and a broken line indicates a transmission characteristic with one-ohm termination.

As is apparent from the transmission characteristic with one-ohm termination, it is found that resonance peaks C1 to C3 appear due to mode coupling. That is, it is found that the resonance peak C1 appears around 1980 MHz, the peak C2 appears around 1925 MHz, a trap is formed around 1915 MHz, and the peak C3 appears around 1900 MHz.

The peaks C1 and C2 are resonance peaks required to define a pass band. The trap formed around 1915 MHz and the peak C3 appearing around 1900 MHz define a side lobe on the low-frequency side of a pass band, and it is found that the attenuation on the low-frequency side of the pass band is increased.

As is apparent from FIG. 4 in comparison with FIGS. 2 and 3, it is found that the attenuation in a stop band adjacent to the low-frequency side of the pass band is larger and the filter characteristics on the low-frequency side of the pass band are sharper. This is because the numbers of electrode fingers satisfy a relationship of N1<N2 and N1<N3. Further, the electrode finger pitches are set to satisfy a relationship of P1<P2 and P1<P3, thereby achieving low insertion loss in the pass band. These advantages will now be described with respect to more specific experiment data.

FIG. 5 is a diagram showing changes in the transmission characteristic with one-ohm termination when the above-described longitudinally-coupled-resonator surface acoustic wave filter device 501 of the related art has a structure with N1=N2=N3 and P1=P2=P3=1.024 μm, where the value of the electrode finger pitch P1 of the first center IDT is reduced by a step of about 0.005 μm. As is apparent from FIG. 5, it is found that as the electrode finger pitch P1 of the first IDT 511 decreases, a trap D produced on the low-frequency side of a pass band is shifted to the high-frequency side. A peak E is generated immediately on the high-frequency side relative to the trap D. It is found that as the electrode finger pitch P1 decreases, the peak E is shifted to the high-frequency side and the bandwidth of the pass band is narrowed.

FIG. 6 shows changes in the transmission characteristic with one-ohm termination when in the above-described longitudinally-coupled-resonator surface acoustic wave filter device 501, the number of electrode fingers N1 of the first IDT 511 is reduced stepwise by four from the conditions where N1=NN2=N3=41 and P2=P3=1.024 μm and P1=P2−0.01 μm, i.e., P1=1.014 μm.

As is apparent from FIG. 6, it is found that as the number of electrode fingers N1 increases, the trap D and the peak E adjacent on the high-frequency side relative to the trap D are shifted to the high-frequency side and the bandwidth of the pass band is also narrowed.

As is apparent from FIG. 6, conversely, as the number of electrode fingers N1 of the first IDT decreases, the trap D is shifted toward the low-frequency side to achieve a wide band, and the attenuation of the peak decreases, thereby reducing the insertion loss.

Accordingly, the trap D and peak E generated in the transmission characteristic with one-ohm termination are used to define a pass band, thereby providing large attenuation in the stop band near the low-frequency side of the pass band and improving sharpness on the low-frequency side of the pass band. In this case, the larger the attenuation of the trap D, the larger the effect of an increase in attenuation. Further, by decreasing the attenuation at the peak E, the insertion loss in the pass band can be reduced.

Figure 8A:
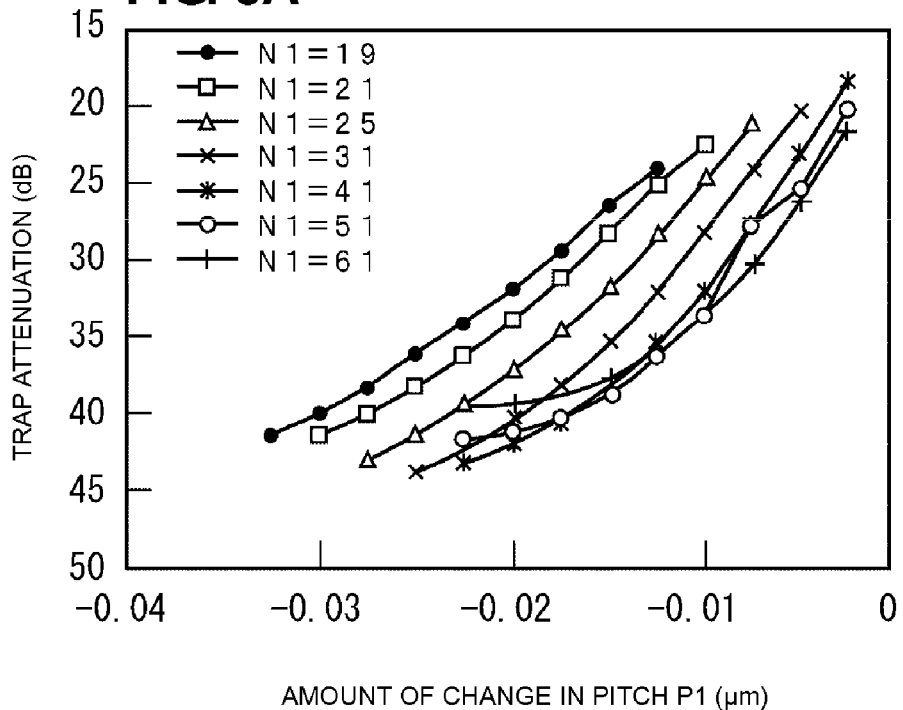
FIGS. 8A and 8B are diagrams showing the amount of change in the electrode finger pitch P1 of the first IDT and changes in attenuation of the trap D and the peak E when the electrode finger pitch P1 is changed.
Figure 8B:
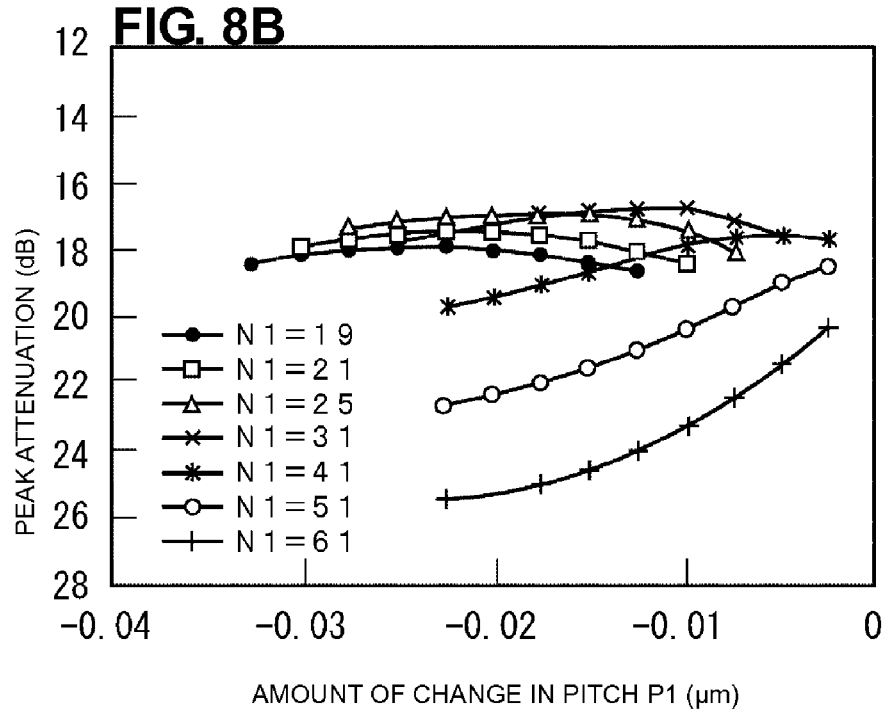

FIG. 8A shows changes in attenuation of the trap D when the electrode finger pitch P1 and the number of electrode fingers N1 of the first IDT are changed, and FIG. 8B shows changes in attenuation of the peak E.

It can be seen from FIG. 8A that when N1>N2 and N3, the attenuation is converged around −40 dB, whereas when N1<N2 and N1<N3, the attenuation is increased more. It can be seen from FIG. 8B that when N1>N2 and N1>N3, the attenuation at the peak E increases as the electrode finger pitch P1 decreases, whereas when N1<N2 and N1<N3, the attenuation can be maintained low.

FIG. 7A shows changes in a trap frequency when the electrode finger pitch P1 and the number of electrode fingers N1 of the first IDT are changed. FIG. 7B shows changes in the frequency of a peak when the electrode finger pitch P1 and the number of electrode fingers N1 of the first IDT are changed.

As is apparent from FIG. 7B, it is found that when the number of electrode fingers N1 is 21, 25, or 31, the peak point is lower than that when N1=19, which is preferable.

FIG. 9 shows a difference between the attenuation of the trap and the attenuation of the peak point when the electrode finger pitch P1 and the number of electrode fingers N1 of the first IDT are changed. When N1<N2 and N1<N3, the attenuation of the trap is large and the attenuation of the peak is small, resulting in a large difference therebetween. Therefore, sharpness on the low-frequency side of the pass band can be improved, and the insertion loss in the pass band can be reduced. Further, the attenuation at the peak point can be smaller than that when N1=N2=N3=41 and P1=P2=P3=1.024 μm.

Accordingly, it can be seen from the results shown in FIGS. 7 to 9 that a larger attenuation in a stop band adjacent to the low-frequency side of a pass band can be obtained and sharper filter characteristics can be obtained by satisfying a relationship of N1<N2 and N1<N3. It can also be found that the insertion loss in the pass band can be reduced by satisfying a relationship of P1<P2 and P1<P3.

A SAW mode analysis was conducted for a frequency position at which the peak point was generated according to "Dai 6-kai Koukinou EM Kairo Debaisu Chosa Senmon Iinkai Shiryo—5 IDT-Gata Taju Modo Ketsugou Kyoshinshi Firuta no SAW Modo Kaiseki (Material of the 6th Research Board Committee on Advanced EM Circuit Devices—SAW Mode Analysis of Five-IDT Multi-Mode Coupled Resonator filter)". As a result, it is found that, as shown in FIG. 10, the distribution of a current was concentrated at the first IDT. The reason why the attenuation of the peak point decreases as the number of electrode fingers N1 of the first IDT decreases is considered to be that the current is more efficiently extracted at the first IDT when the number of electrode fingers N1 is small. However, if the number of electrode fingers N1 is too small, the electric resistance increases conversely, resulting in a large attenuation of the peak point. In the present preferred embodiment, therefore, it is preferable that the number of electrode fingers N1 be not less than 21.

Figure 11:
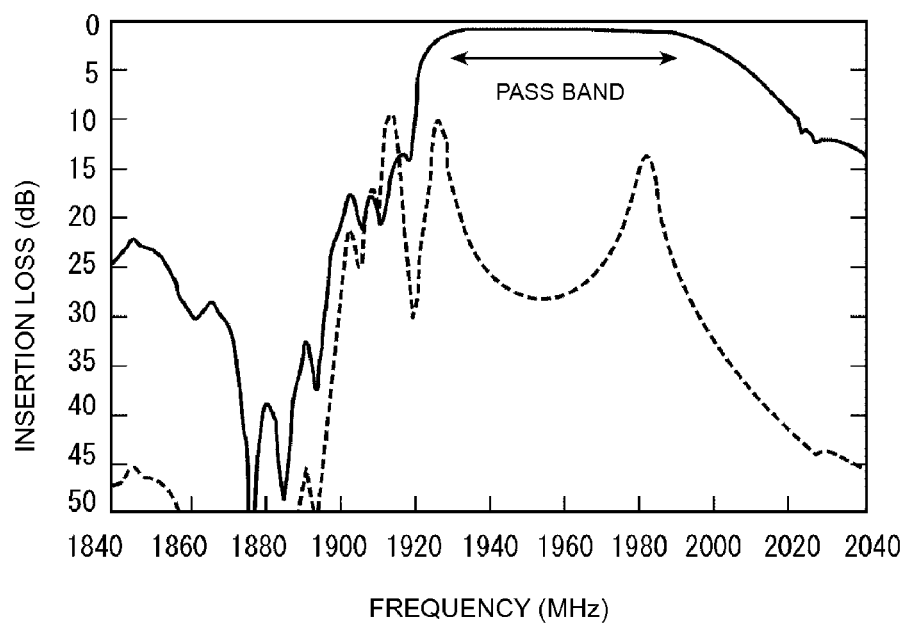
FIG. 11 is a diagram showing a transmission characteristic of a longitudinally-coupled-resonator surface acoustic wave filter device of a second preferred embodiment, and a transmission characteristic with one-ohm termination.

Next, a five-IDT longitudinally-coupled-resonator surface acoustic wave filter device according to a second preferred embodiment was manufactured in a manner similar to that of the first preferred embodiment shown in FIG. 1, except that the design parameters were changed to those described below. FIG. 11 shows a transmission characteristic of the thus obtained longitudinally-coupled-resonator surface acoustic wave filter device of the second preferred embodiment, and a transmission characteristic with one-ohm termination.

Interdigital length of the electrode fingers: 45 μm
Number of electrode fingers of the IDTs (in the order of the fourth IDT 14, the second IDT 12, the first IDT 11, the third IDT 13, and the fifth IDT 15): 45, 45, 34, 45, and 45
Number of electrode fingers of the reflectors=100
Metallization ratio=0.68
Electrode film thickness=0.08 $\lambda_r$.
Electrode finger pitch P1 of the first IDT 11=1.014 μm, P2=1.022 μm, P3=1.027 μm Also in the second preferred embodiment, a relationship of P1<P2, P1<P3, N1<N2, and N1<N3 is satisfied. Therefore, as is apparent from FIG. 11, it is found that sharp filter characteristics are obtained on the low-frequency side of a pass band and the insertion loss in the pass band is reduced.

Figure 12:
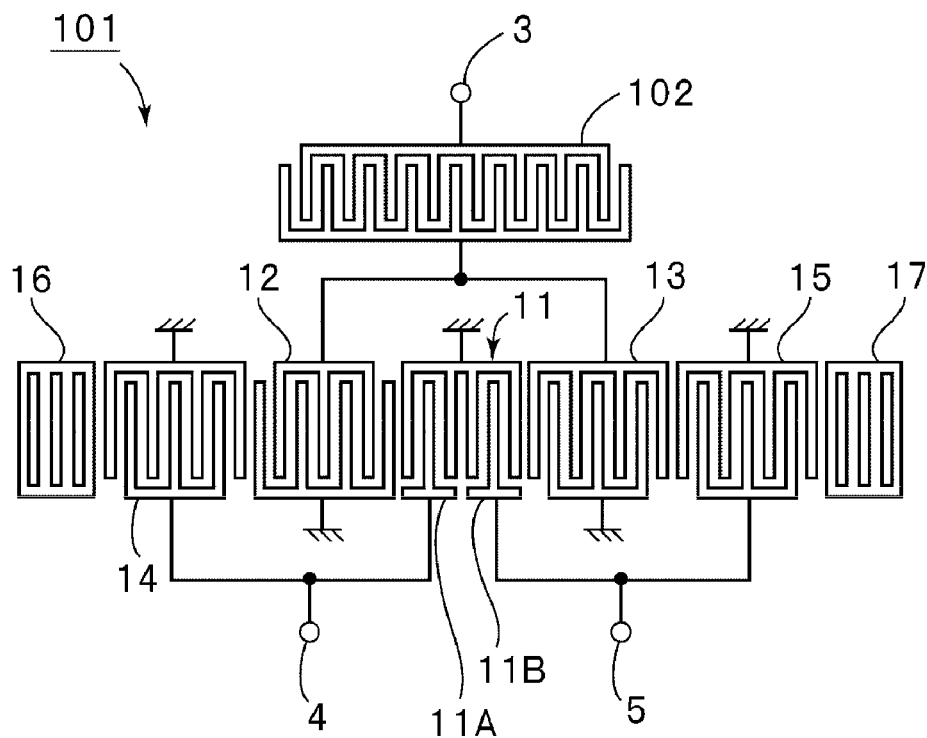
FIG. 12 is a schematic plan view showing an electrode structure of a longitudinally-coupled-resonator surface acoustic wave filter device according to a modification of preferred embodiments of the present invention.
Figure 13:
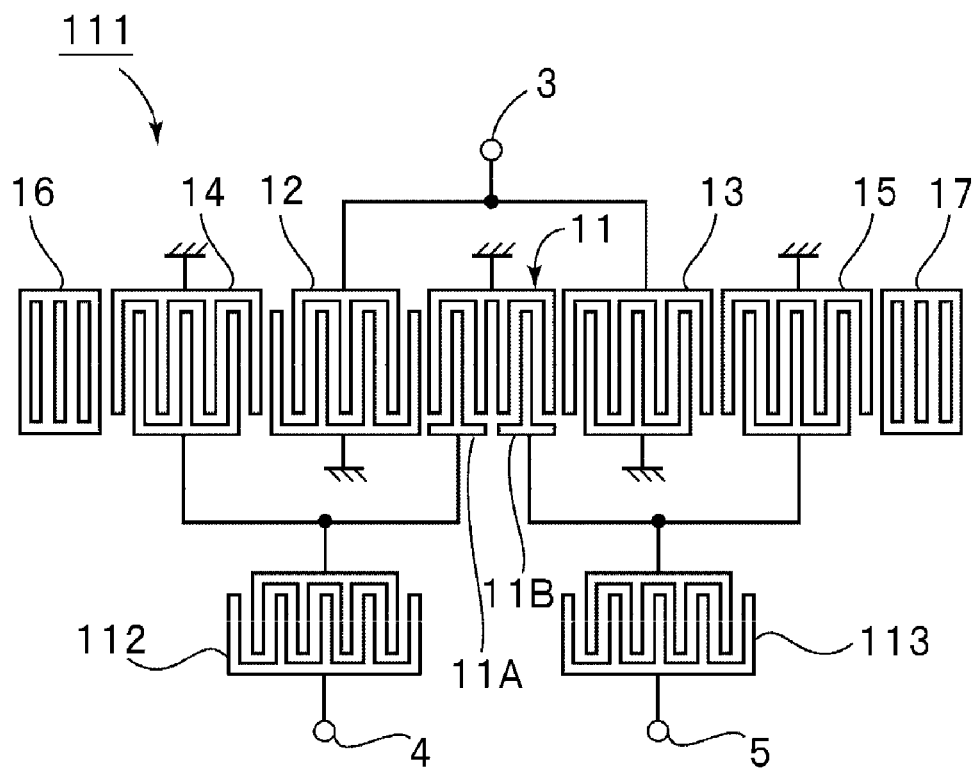
FIG. 13 is a schematic plan view showing an electrode structure of a longitudinally-coupled-resonator surface acoustic wave filter device according to another modification of preferred embodiments of the present invention.

The longitudinally-coupled-resonator surface acoustic wave filter device of the present invention is not limited to that having the electrode structure of the first or second preferred embodiments. In a longitudinally-coupled-resonator surface acoustic wave filter device 101 according to a modification thereof shown in FIG. 12, a one-terminal-pair surface acoustic wave resonator 102 is further connected to the first longitudinally-coupled-resonator surface acoustic wave filter device 1. Specifically, the one-terminal-pair surface acoustic wave resonator 102 is connected in series between the unbalanced signal terminal 3 and the common connection of the second and third IDTs 12 and 13 of the first longitudinally-coupled-resonator surface acoustic wave filter 1. In a longitudinally-coupled-resonator surface acoustic wave filter device 111 shown in FIG. 13, one-terminal-pair surface acoustic wave resonators 112 and 113 are connected in series between the first longitudinally-coupled-resonator surface acoustic wave filter device 1 and the first balanced signal terminal 4 and between the first longitudinally-coupled-resonator surface acoustic wave filter device 1 and the second balanced signal terminal 5, respectively.

Figure 14:
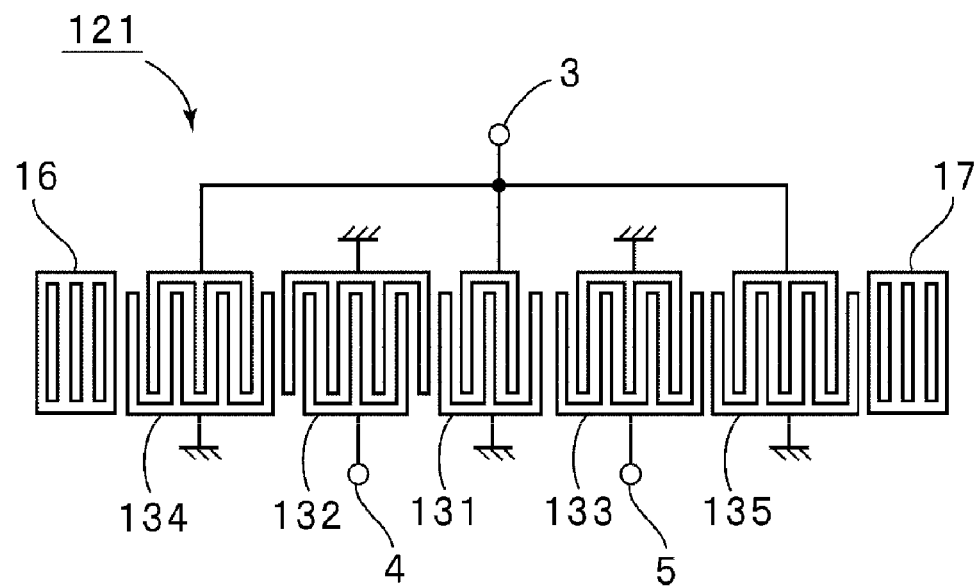
FIG. 14 is a schematic plan view showing an electrode structure of a longitudinally-coupled-resonator surface acoustic wave filter device according to still another modification of preferred embodiments of the present invention.
Figure 15:
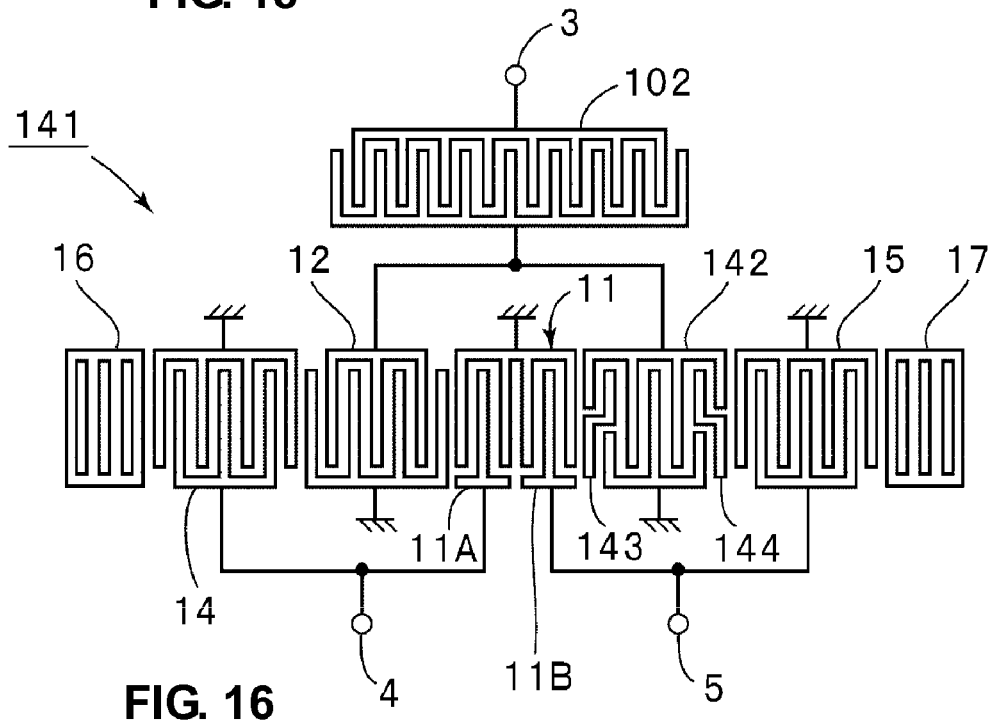
FIG. 15 is a schematic plan view showing an electrode structure of a longitudinally-coupled-resonator surface acoustic wave filter device according to still another modification of preferred embodiments of the present invention.

Accordingly, at least one surface acoustic wave resonator may be connected in series between a longitudinallycoupled-resonator surface acoustic wave filter device and an unbalanced signal terminal or a balanced signal terminal, in which case a large attenuation on the high-frequency side of the pass band can be obtained. In a longitudinally-coupled-resonator surface acoustic wave filter device 121 according to a modification shown in FIG. 14, a first IDT 131 preferably is a standard IDT having no divided IDT portions. First ends of the first IDT 131 and fourth and fifth outermost IDTs 134 and 135 in a direction of propagation of surface waves are commonly connected, and are electrically connected to an unbalanced signal terminal 3, while second terminals of the first, fourth, and fifth IDTs 131, 134, and 135 are connected to a ground potential. Further, first ends of second and third IDTs 132 and 133 are connected to the ground potential, and second ends of the second and third IDTs 132 and 133 are connected to first and second balanced signal terminals 4 and 5, respectively. In this way, the balance-unbalance conversion function may be achieved by using the first to fifth IDTs 131 to 135 without providing divided IDT portions. Furthermore, a longitudinally-coupled-resonator surface acoustic wave filter device 141 shown in FIG. 15 has a structure in which the one-terminal-pair surface acoustic wave resonator 102 is connected to the first longitudinally-coupled-resonator surface acoustic wave filter device 1 in which series weighting is applied. The series weighting is applied by providing floating electrode fingers 143 and 144 so as to reach a region defined between electrode fingers on either side of a third IDT 142 in a direction of propagation of surface waves and electrode fingers located therebetween. The remaining elements are configured in a manner similar to that in the longitudinally-coupled-resonator surface acoustic wave filter device 101 shown in FIG. 12.

In various preferred embodiments of the present invention, therefore, series weighting may be applied, as necessary, to IDTs of a five-IDT longitudinally-coupled-resonator surface acoustic wave filter. The series weighting allows excitation to be weakened on both sides of the floating electrode fingers 143 and 144 and balance to be improved.

The present invention is not limited to the above-described longitudinally-coupled-resonator surface acoustic wave filter having a balance-unbalance conversion function, and may include a longitudinally-coupled-resonator surface acoustic wave filter having no balance-unbalance conversion function, e.g., the five-IDT longitudinally-coupled-resonator surface acoustic wave filter shown in FIG. 16. In either five-IDT longitudinally-coupled-resonator surface acoustic wave filter, by satisfying the relationship of N1<N2, N1<N3, P1<P2, and P1<P3, as described above, a large attenuation in a stop band near the low-frequency side of a pass band can be obtained, and sharp filter characteristics can be obtained. Further, the insertion loss in the pass band can be reduced.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A longitudinally-coupled-resonator surface acoustic wave filter device comprising:

a piezoelectric substrate;
a first IDT disposed on the piezoelectric substrate;
second and third IDTs arranged on either side of the first IDT in a direction of propagation of surface waves;
fourth and fifth IDTs arranged on either side of a portion in the direction of propagation of surface waves where the first to third IDTs are disposed; and
first and second reflectors arranged on either side of a portion in the direction of propagation of surface waves where the first to fifth IDTs are disposed; wherein
when the number of electrode fingers and electrode finger pitch of the first IDT are represented by N1 and P1, respectively, the number of electrode fingers and electrode finger pitch of the second and third IDTs are represented by N2 and P2, respectively, and the number of electrode fingers and electrode finger pitch of the fourth and fifth IDTs are represented by N3 and P3, respectively, the numbers of electrode fingers and electrode finger pitches of the first to fifth IDTs are determined so as to satisfy a relationship of N1<N2, N1<N3, P1<P2, and P1<P3.

2. The surface acoustic wave filter device according to claim 1, further comprising an unbalanced signal terminal, and first and second balanced signal terminals, wherein the second IDT is different in phase by 180° from the third IDT, one end of each of the second and third IDTs is connected to the unbalanced signal terminal, the first IDT is divided into a first divided IDT portion and a second divided IDT portion in the direction of propagation of surface waves, and the first divided IDT portion and the fourth IDT are connected to the first balanced signal terminal, and the second divided IDT portion and the fifth IDT are connected to the second balanced signal terminal.

3. The surface acoustic wave filter device according to claim 2, wherein at least one one-terminal-pair surface acoustic wave resonator is connected to at least one of the unbalanced signal terminal and the first and second balanced signal terminals.

4. The surface acoustic wave filter device according to claim 1, further comprising an unbalanced signal terminal, and first and second balanced signal terminals, wherein the second IDT is different in phase by 180° from the third IDT, one end of each of the first, fourth, and fifth IDTs is connected to the unbalanced signal terminal, and the second IDT is connected to the first balanced signal terminal, and the third IDT is connected to the second balanced signal terminal.

5. The surface acoustic wave filter device according to claim 1, wherein in at least one of any two adjacent IDTs in both portions where the first and second IDTs are adjacent to each other and where the second and fourth IDTs are adjacent to each other, series weighting is applied to a plurality of electrode fingers including an outermost electrode finger that is most adjacent to the other IDT.

6. The surface acoustic wave filter device according to claim 1, wherein in at least one of both portions where the first and third IDTs are adjacent to each other and where the third and fifth IDTs are adjacent to each other, series weighting is applied to a plurality of electrode fingers including an outermost electrode finger that is most adjacent to the other IDT.

* * * * *